United States Patent
Acar et al.

(10) Patent No.: US 7,279,761 B2
(45) Date of Patent: Oct. 9, 2007

(54) POST-RELEASE CAPACITANCE ENHANCEMENT IN MICROMACHINED DEVICES AND A METHOD OF PERFORMING THE SAME

(75) Inventors: Cenk Acar, Irvine, CA (US); Andrei M. Shkel, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 293 days.

(21) Appl. No.: 10/943,097

(22) Filed: Sep. 15, 2004

(65) Prior Publication Data

US 2006/0054983 A1    Mar. 16, 2006

(51) Int. Cl.
*H02N 1/00* (2006.01)
(52) U.S. Cl. .......... 257/415; 257/417; 257/E29.324; 438/50; 310/309; 73/514.32; 73/514.18
(58) Field of Classification Search .......... 257/415, 257/E21.324, 417; 438/50; 310/309; 73/514.32, 73/514.18
See application file for complete search history.

(56) References Cited

U.S. PATENT DOCUMENTS

| | | | |
|---|---|---|---|
| 5,563,343 A * | 10/1996 | Shaw et al. .......... 73/514.18 |
| 5,992,233 A * | 11/1999 | Clark .......... 73/514.35 |
| 5,998,906 A * | 12/1999 | Jerman et al. .......... 310/309 |
| 6,133,670 A * | 10/2000 | Rodgers et al. .......... 310/309 |
| 6,211,599 B1 * | 4/2001 | Barnes et al. .......... 310/309 |
| 6,384,510 B1 * | 5/2002 | Grade et al. .......... 310/309 |
| 6,424,504 B1 * | 7/2002 | Abe et al. .......... 360/294.4 |
| 2002/0046602 A1 * | 4/2002 | Geen et al. .......... 73/504.02 |
| 2002/0144548 A1 * | 10/2002 | Cohn et al. .......... 73/514.16 |
| 2004/0035204 A1 * | 2/2004 | Durante et al. .......... 73/504.04 |
| 2004/0113513 A1 * | 6/2004 | Borwick et al. .......... 310/309 |
| 2004/0182155 A1 * | 9/2004 | Najafi et al. .......... 73/514.32 |
| 2005/0126287 A1 * | 6/2005 | Malametz .......... 73/504.12 |

* cited by examiner

*Primary Examiner*—Bradley K. Smith
*Assistant Examiner*—Steven J. Fulk
(74) *Attorney, Agent, or Firm*—Myers Dawes Andras & Sherman LLP

(57) ABSTRACT

A MEMS device which utilizes a capacitive sensor or actuator is enhancement by initially fabricating the capacitive assembly which comprises the sensor or actuator as two sets of interdigitated fingers in a noninterdigitated configuration. One of the two sets of fingers is coupled to a movable stage. The stage is moved from an initial position to a post-release position in which the two sets of interdigitated fingers are interdigitated with each other. The stage is carried by two pairs flexures which maintain the stability of motion of the stage and when in the post-release position provide stiffness which prevents deflection of the set of fingers coupled to the stage. The stage and hence the assembled sets of fingers are then locked into the post-release position.

18 Claims, 15 Drawing Sheets

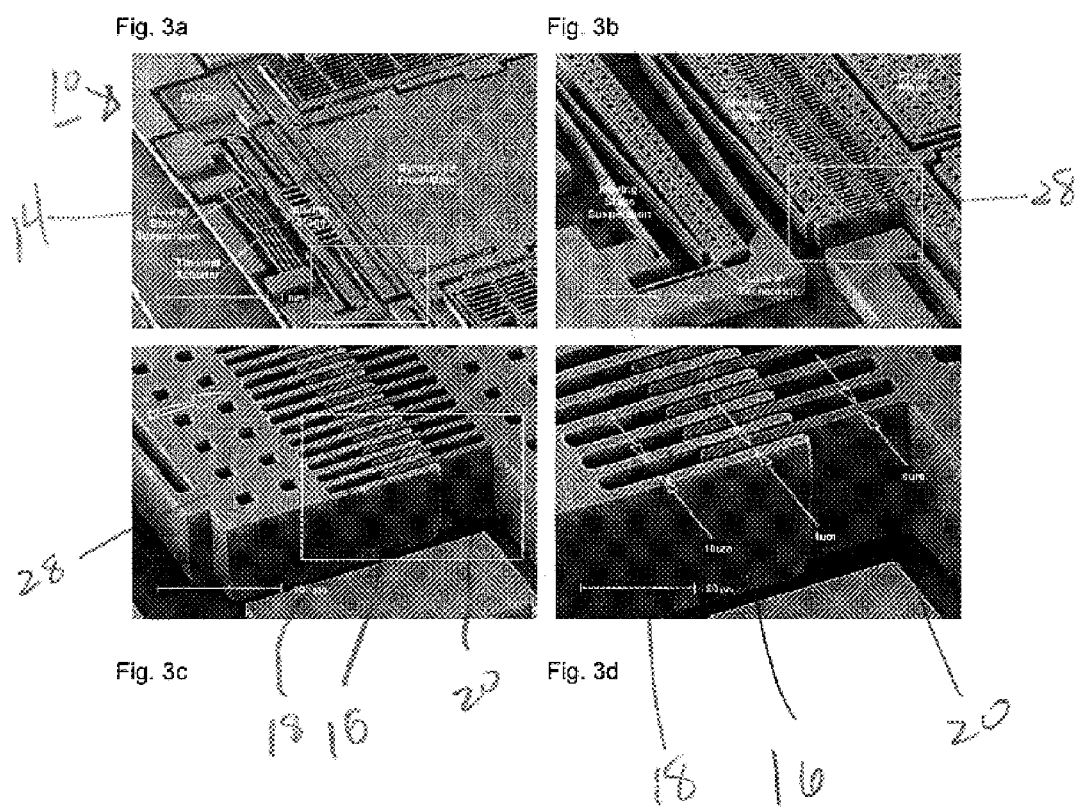

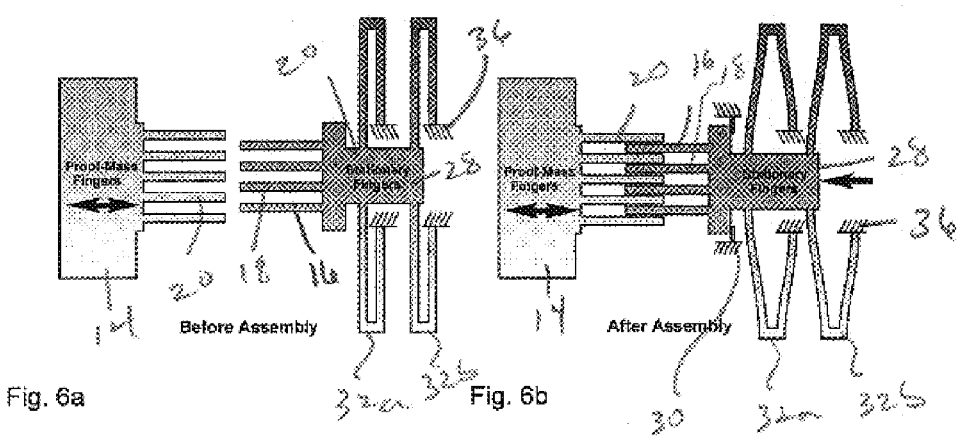

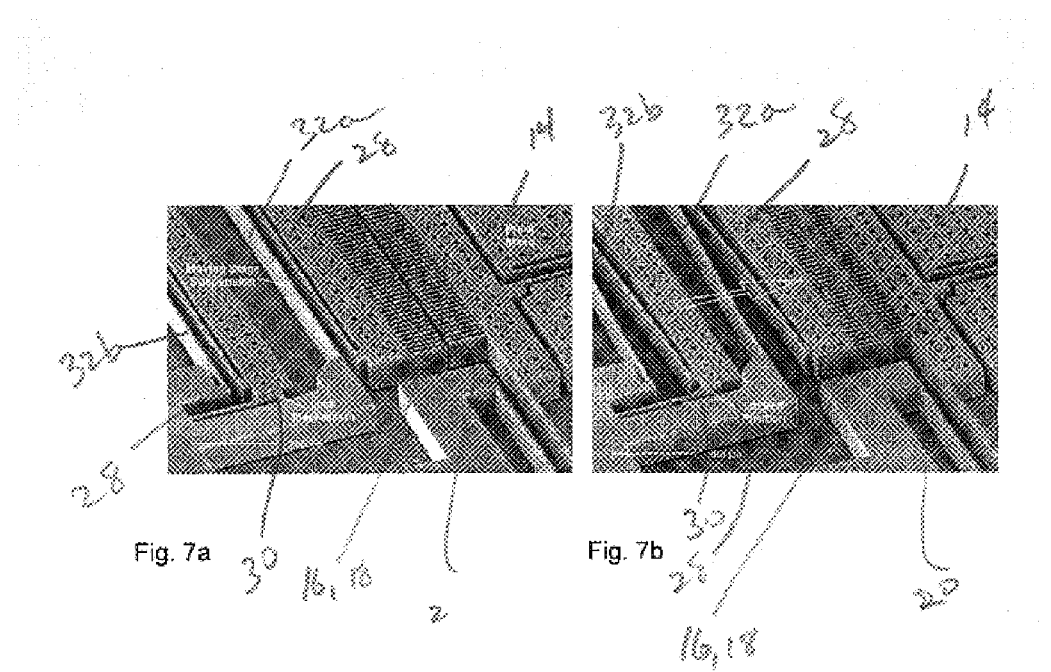

1- Initial position.  2- Before contact.

3- Lock-in flexed.  4- Locked position.

Fig. 12a
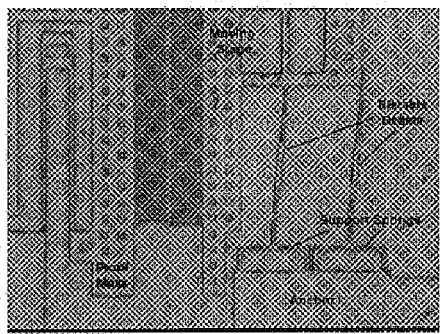
1- Initial, first stable point.
Fig. 12b
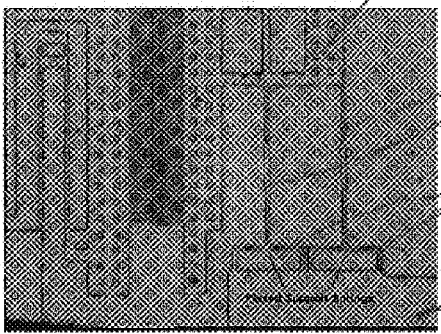
2- Unstable snapping point.
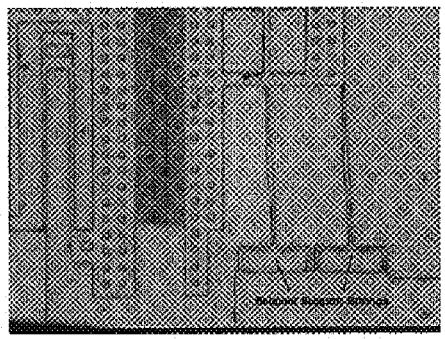
3- Final, second stable point.
Fig. 12c
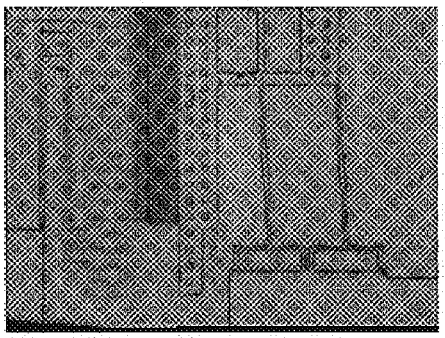
4- Resonance in locked position.
Fig. 12d

POST-RELEASE CAPACITANCE ENHANCEMENT IN MICROMACHINED DEVICES AND A METHOD OF PERFORMING THE SAME

BACKGROUND OF THE INVENTION

1. Field of the Invention

The invention relates to the field of micromachined sensors and actuators and in particular to post-release enhancement of detection and actuation capacitances in micromachined sensors and actuators.

2. Description of the Prior Art

Capacitive detection and actuation are commonly used in micromachined devices due to simplicity of implementation and effectiveness. However, the performance of capacitive sensors and actuators highly depends on the nominal capacitance of the microsystem. For example, in capacitive micromachined inertial sensors (i.e. accelerometers, gyroscopes, etc.) the performance is generally defined by the nominal capacitance of the sensing electrodes. Furthermore, in electrostatically actuated devices, the nominal actuation capacitance determines the required drive voltages. For a small actuation capacitance, large voltages are needed to achieve sufficient forces, which in turn results in a large drive signal feed-through. Thus, it is desired to maximize the sensing capacitance, and minimize the actuation voltages by increasing the actuation capacitance. However, the sensing and actuation capacitances of micromachined devices are limited by the minimum-gap requirement of the fabrication process.

In the micro-domain, capacitive sensing and actuation offer several benefits when compared to other sensing and actuation means (piezoresistive, piezoelectric optical, magnetic, etc.) with their ease of fabrication and integration, good DC response and noise performance, high sensitivity, low drift, and low temperature sensitivity. However, the performance of micromachined sensors employing capacitive detection is generally determined by the nominal capacitance of the sensing electrodes. Even though increasing the overall sensing area provides improved sensing capacitance, the sensing electrode gap is the foremost factor that defines the upper bound. Various advanced fabrication technologies have been reported (e.g. oxidation machining) that provide minimal electrode gap.

However, all of these approaches require additional expensive fabrication steps. In electrostatically actuated devices such as micromachined gyroscopes, the nominal actuation capacitance determines the required drive voltages. For a small actuation capacitance, large voltages are needed to achieve sufficient forces, which in turn results in a large drive signal feed-through. The drive signal feed-through is generally a major noise source, and often a larger signal than the measured Coriolis signal. Thus, these devices are conventionally operated in vacuum to achieve large amplitudes with low actuation voltages to minimize the drive feed-through, which results in an extremely narrow response bandwidth. Similarly, the force generated by the electrostatic actuation electrodes (comb-drives or parallel-plates) is limited by the minimum gap attainable in the used fabrication process. MEMS designers are facing challenges similar to those exemplified above while implementing other electrostatic MEMS sensors and actuators.

The following section analytically illustrates the dependence of sensing and actuation capacitances on the design and fabrication parameters. Then, prior techniques to enhance capacitance are presented.

BRIEF SUMMARY OF THE INVENTION

The disclosed post-release assembly technique increases the sensing and actuation capacitances in micromachined inertial sensors, in order to enhance the performance and noise characteristics beyond the fabrication process limitations. The approach is based on attaching the stationary electrodes of the device to a moving stage that locks into the desired position to minimize the electrode gap before operation. The explored locking mechanisms include, but are not limited, to ratcheted structures and bistable mechanisms. Thermal actuators are employed for displacing the moving stage, but other actuation means are included with the contemplation and scope of the invention. The illustrated embodiment of the invention has been implemented in bulk-micromachined prototype gyroscopes, and the experimental results have successfully demonstrated the feasibility of the design concept.

The invention is an improvement in a MEMS device which provides capacitive enhancement of the electrostatic actuators and capacitive sensors in the device. The MEMS device illustratively comprises a capacitive assembly having two sets of interdigitated fingers fabricated initially in a noninterdigitated configuration. A movable stage is coupled to one of the two sets of interdigitated fingers. An actuator selectively moves the stage from an initial position to a post-release position in which the two sets of interdigitated fingers are interdigitated with each other. A lock then maintains the stage in the post-release position.

In the preferred embodiment the noninterdigitated configuration is characterized by a minimum, fabricated gap size between adjacent fingers in each of the two sets, so that when in the post-release position the fingers in the two sets are spaced from each by less than the minimum, fabricated gap size.

The capacitive assembly may comprise a capacitive sensor assembly or an electrostatic actuator assembly. The lock comprises a ratchet lock mechanism or a bistable lock mechanism. The actuator comprises a thermal actuator. The MEMS device itself may comprises a gyroscope or accelerometer.

The device is fabricated in or on a substrate. The stage comprises a stage body to which the one set of fingers are coupled, and two pairs of flexures coupling the stage body to the substrate. The two pairs of flexures function as a four-bar linkage to restrict movement of the stage body in a stable linear direction. The two pairs of flexures are arranged and configured to provide high stiffness when the stage is locked into the post-release position so that the one set of fingers coupled to the stage body is substantially prevented from deflecting.

The invention also comprises a method of assembling a MEMS device to provide an enhanced capacitive function as described above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 1 is a diagram of a prior art capacitive sensor.

FIGS. 3a–3d are microphotographs of an interdigitated capacitive structure which has been fabricated and assembled according to the invention.

FIGS. 6a and 6b are simplified diagrams of the material components of the invention in its configuration before assembly and after assembly respectively.

FIGS. 7a and 7b are perspective view microphotographs of the material components of the invention in its configuration before assembly and after assembly respectively as diagrammatically depicted in FIGS. 5, 6a and 6b and showing assembly and locking of the stage using a ratchet mechanism.

FIGS. 12a–12d are top plan view microphotographs of the bistable locking mechanism of FIGS. 11a and 11b in a capacitive sensor.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Consider first some basics of electrostatic actuation and detection by way of general background. The electrostatic actuation and sensing components of micromachined devices can be modeled as a combination of parallel-plate capacitors 10 as shown in diagrammatic perspective view in FIG. 1. In the most general case, the capacitance between two parallel plates can be expressed as $$C = \varepsilon_0 \frac{A_{overlap}}{y_0} = \varepsilon_0 \frac{x_0 z_0}{y_0}. \tag{1}$$

where $\varepsilon_0 = 8.854 \times 10^{12}$ F/m is the dielectric constant, $x_0 \times z_0 = A_{overlap}$ is the total overlap area, $y_0$ is the electrode gap.

In parallel-plate electrodes, the electrostatic force is generated due to the electrostatic conservative force field between the plates 12. Thus, the force can be expressed as the gradient of the potential energy U stored on the capacitor $$\vec{F} = -\nabla U = \frac{\nabla C(x,y,z)V^2}{2} = \frac{\varepsilon_0 \nabla \left(\frac{x_n z_n}{y_0}\right) V^2}{2} \tag{2}$$

Figure 1:
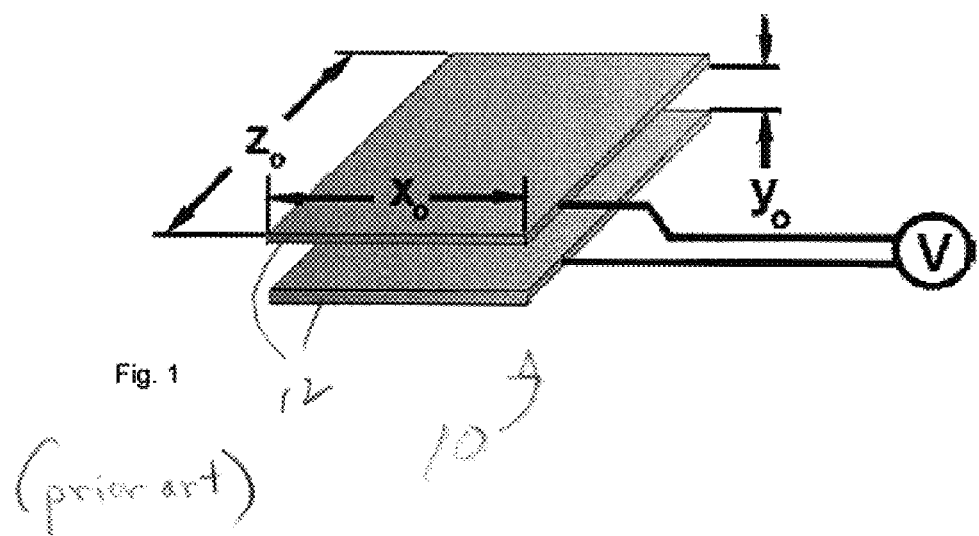
FIG. 1 is a diagram of a capacitive structure illustrating the physical principles in which the capacitive enhancement of the invention is realized.

In the case of comb-drives, the actuation force is generated through a combination of parallel plates sliding parallel to each other which in the illustration of FIG. 1 is in the x-direction. The electrostatic force generated in the x-direction as two plates slide parallel to each other in the x-direction reduces to $$\vec{F}_x = \frac{\varepsilon_0 V^2 z_0}{2 y_0} \hat{e}_x. \tag{3}$$

It should be noticed that this force is independent of displacement in the x-direction and the overlapping area of the capacitor fingers. However, the electrostatic force generated in the y-direction as the plates approach to each other in the y-direction, which is the case for parallel-plate actuation, depends on the overlap area and is a nonlinear function of displacement y:

$$\vec{F}_y = -\frac{\varepsilon_0 V^2 z_0 x_0}{2(y_0 - y)^2} \hat{e}_y. \tag{4}$$

Electrostatic actuation comb-drives are one of the most common actuation structures used in MEMS devices. The primary advantages of comb-drives are the linearity of the generated forces, and the ability of applying displacement-independent forces for high-stability actuators. Linearized drive forces along the x-axis can be achieved by appropriate selection of voltages applied to the opposing comb-drive sets. A balanced interdigitated comb-drive scheme is imposed by applying $V_1 = V_{DC} + V_{AC}$ to one set of comb drives, and $V_2 = V_{DC} - V_{AC}$ to the other set, where $V_{DC}$ is a constant bias voltage, and $V_{AC}$ is a time-varying voltage. Assuming negligible deflections along the y-axis, the net electrostatic force reduces to $$F = 4 \frac{\varepsilon_0 z_0 N}{y_0} V_{DC} v_{AC}. \tag{5}$$

where $z_0$ is the finger thickness, and $y_0$ is the finger separation. It should be noticed that, the net force along the x-axis is independent of the displacement along the x-axis, and the overlap length. The force is proportional to the drive voltages and the device thickness, however, the net force increases exponentially with decreasing gap between the fingers.

Figure 2:
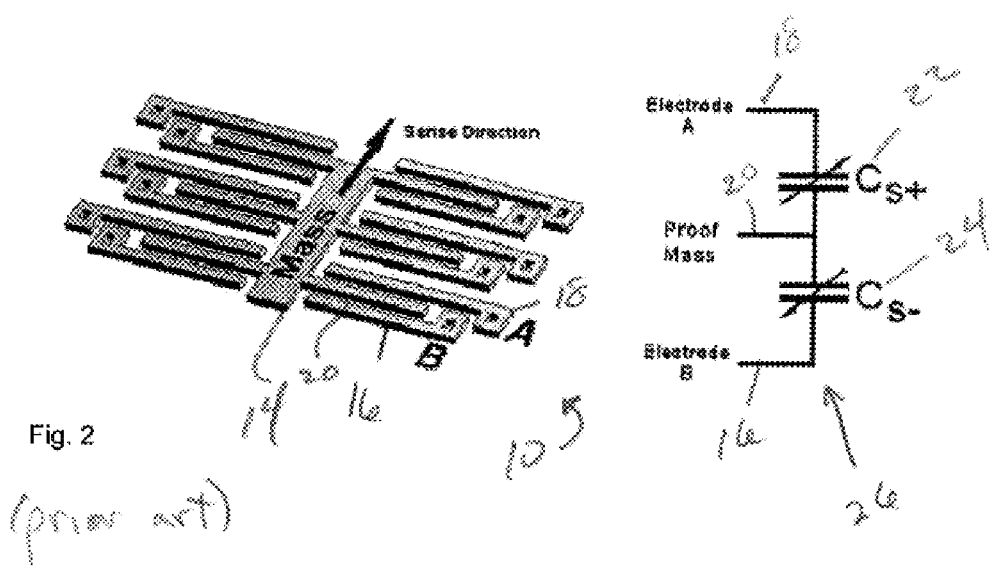

Consider now capacitive sensing by building parallel-plate sense capacitors connected to a moving proof-mass 14 of a sensor 10 as diagrammatically depicted in FIG. 2. A mass 14 has a perpendicularly extending finger 20 disposed between two parallel electrode fingers 16 and 18, which collectively form the differential capacitance bridge 26. The deflection is sensed as a difference in capacitance. The deflection of the mass 14 changes the electrode gap, and the resulting capacitance change is detected. The fingers 16, 18 and 20 serve as differential air-gap sense capacitors for response sensing. Differential capacitance sensing is generally employed to linearize the capacitance change with deflection.

For a positive displacement, the finger 20 attached to the mass 14 approaches finger 18 increasing the capacitance Cs+, 22 and moves away from finger 16 decreasing the capacitance Cs−, 24. By building a differential capacitive bridge 26, the deflection is translated to a change in capacitance. Defining $y_0$ as the finger separation, l as the length of the fingers, and t as the thickness of the fingers; the differential capacitance values can be calculated as $$C_{s+} = N\frac{\varepsilon_0 tl}{y_0 - y}, C_{s-} = N\frac{\varepsilon_0 tl}{y_0 + y}, \Delta C = C_{s+} - C_{s-} = 2N\frac{\varepsilon_0 tl}{y_0^2}y \quad (6)$$

It is observed that the capacitance change is inversely proportional to the square of the initial gap. Thus, the performance of the sensor, i.e. sensitivity, resolution, and signal to noise ratio, is improved quadratically by decreasing the initial gap of the sensing electrodes 16, 18 beyond the minimum-gap capabilities of the fabrication process.

Consider now prior art capacitance enhancement techniques. The sensing electrode gap is the foremost factor that defines the upper bound on the sensing performance. Various advanced fabrication technologies have been reported to minimize electrode gap, based on deposition of thin layers on electrode sidewalls. For example, in one reported approach, high aspect-ratio polysilicon structures are created by refilling deep trenches with polysilicon deposited over a sacrificial oxide layer. Thick single-crystal silicon structures are released from the substrate through the front side of the wafer by means of a combined directional and isotropic silicon dry etch and are protected on the sides by refilled trenches. This process involves one layer of low-pressure chemical vapor deposited (LPCVD) silicon nitride, one layer of LPCVD silicon dioxide, and one layer of LPCVD polysilicon. See F. Ayazi, and K. Najafi. High Aspect-Ratio Combined Poly and Single-Crystal Silicon (HARPSS) MEMS Technology Journal of Microelectromechanical Sytems, Vol. 9, 2000, pp. 288–294. However, this example process and all other similar approaches require additional expensive fabrication steps and alignment, and increase the resulting cost. In this approach, high aspect-ratio polysilicon structures are created by refilling deep trenches with polysilicon deposited over a sacrificial oxide layer.

Consider enhancement of actuation capacitance according to the illustrated embodiment of the invention. The illustrated embodiment of the post-release assembly technique of the invention aims to increase the capacitances in micromachined devices, in order to achieve low actuation voltages, and enhance the performance and noise characteristics beyond the fabrication process limitations. For the purpose of illustration and demonstration, the concept is implemented on MEMS vibratory gyroscopes, but can be applied to any type of MEMS sensors.

The approach is based on attaching the stationary electrodes 16 and 18 of the device 10 to a moving stage 28 that locks into the desired position to minimize the electrode gap before operation. The scanning-electron-microscope images of post-release positioned comb-drives integrated in a micromachined gyroscope are presented in FIG. 3 in a micromachined gyroscope. The minimum gap requirement of the fabrication process is approximately 10 μm. The resulting gap between the stationary fingers 16, 18 and moving fingers 20 after the assembly is approximately 1 μm. In conventional interdigitated comb-drives, the gap between each stationary finger 16, 18 and moving finger 20 is determined by the minimum-gap requirement of the fabrication process. For example, if the minimum gap is 10 μm, the gap between the conventional comb-drive fingers is 10 μm. However, in the presented post-release positioning approach, the fingers attached to opposing electrodes are designed initially apart, and interdigitated after the release. Thus, the gap between the fingers after interdigitating can be much smaller than the minimum-gap requirement.

Figures 4A, 4B, 4C:
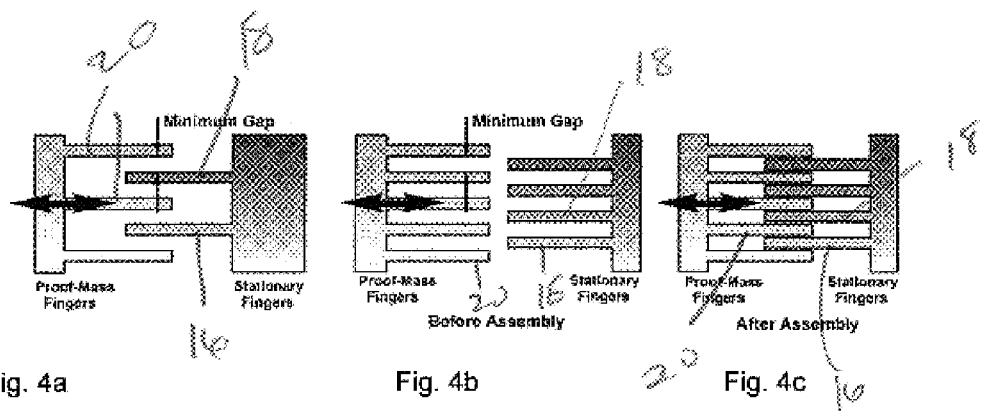
FIGS. 4a–4c are diagrams illustrating the prior art assembly in FIG. 4a and the assembly of the invention in FIGS. 4b and 4c before assembly and after assembly respectively.

Consider for example a comparison of a conventional comb-drive structure, and the post-release positioning approach before and after assembly designed for the same fabrication process as illustrated in the diagrams of FIGS. 4a–4c. FIG. 4a is a diagrammatic depiction of the prior art topology during the fabrication of stationary fingers 16 and 18 interdigitated between the proof of mass fingers 20. Here, if the minimum finger gap which can be fabricated is 10 μm then the overall spacing of the assembly of fingers 16, 18 and 20 will necessarily be at least 20 μm across. FIGS. 4b and 4c are diagrams illustrating the interdigitated finger assembly of the invention before assembly and after assembly respectively. Again, before assembly as seen in FIG. 4b the minimum gap between fingers 16 and 18 is assumed to be 10 μm and the minimum gap between adjacent ones of fingers 20 is 10 μm. Notice the substantial decrease in the size of the resulting gap and the number of fingers per unit area in the assembled configuration of FIG. 4c when the fingers are moved toward each other in an enmeshed or interdigitated configuration.

For the same example, if the width of one finger is approximately 8 μm and the minimum gap is 10 μm; the resulting gap between the stationary and moving fingers after the assembly is approximately 1 μm. This results in 10 times increase in the force per finger. Furthermore, the number of fingers per unit area is increased by allowing smaller gaps. In this example, exactly twice the number of fingers can be used in the same area, resulting in a total of 20 times increase in the drive-force.

Figure 5:
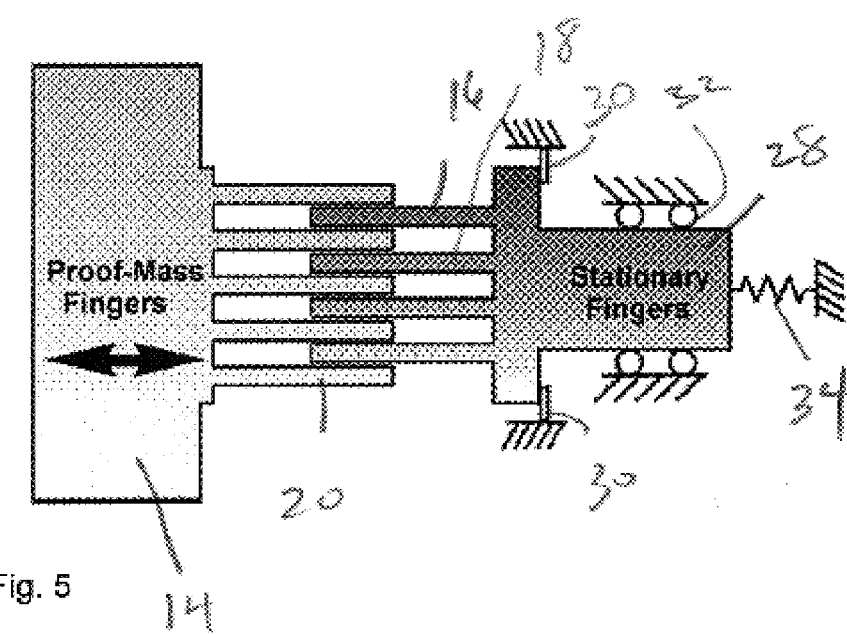
FIG. 5 is a simplified functional diagram of the material components of the invention as assembled.

FIG. 5 is a diagram of the flexure system suspending the moving stage 28 which provides very high stiffness after assembly, so that the stationary fingers 16, 18 are prevented from deflecting, and the required lateral stability is achieved. FIG. 5 functionally illustrates a locking mechanism 30 which will lock stage 28 in the interdigitated position, bearings or flexures 32 which allow the laterally stable motion of stage 28 and a stiffness flexure 34 which provides high lateral stiffness after assembly.

FIGS. 6a and 6b are structural diagrams of the post-release positioning comb-drives assembly before and after assembly respectively. A pair of U-shaped resilient flexures 32a and 32b between the substrate 36 and stage 28 provide for stable lateral movement of stage 28. In FIG. 6b lock 30 is shown diagrammatically an engaged with stage 28 and retaining stage 28 in the deployed or interdigitated configuration. The moving stage flexure system 32a and 32b provides a straight line of displacement, and excellent alignment of the fingers 16, 18 and 20. FIGS. 7a and 7b are scanning-electron-microscope images of post-release positioning comb-drives integrated in a micromachined gyroscope before assembly, and after assembly respectively as diagrammatically depicted in FIGS. 5, 6a and 6b. A comparison of FIGS. 7a and 7b shows movement of stage 28 from a completely unmeshed configuration in FIG. 7a and an enmeshed configuration in FIG. 7b. As will be shown in greater detail below lock 30 is comprised of a leaf spring with a ratchet which resiliently rides over the side of stage 28 and then collapses inward to form a blocking stop when stage 28 is in the interdigitated configuration. The concept has been implemented in bulk-micromachined gyroscopes, and the experimental results have successfully demonstrated the feasibility of the design concept. Again it must be understood that the invention contemplates application in any capacitive MEMS sensor.

Figures 8A, 8B, 8C, 8D:
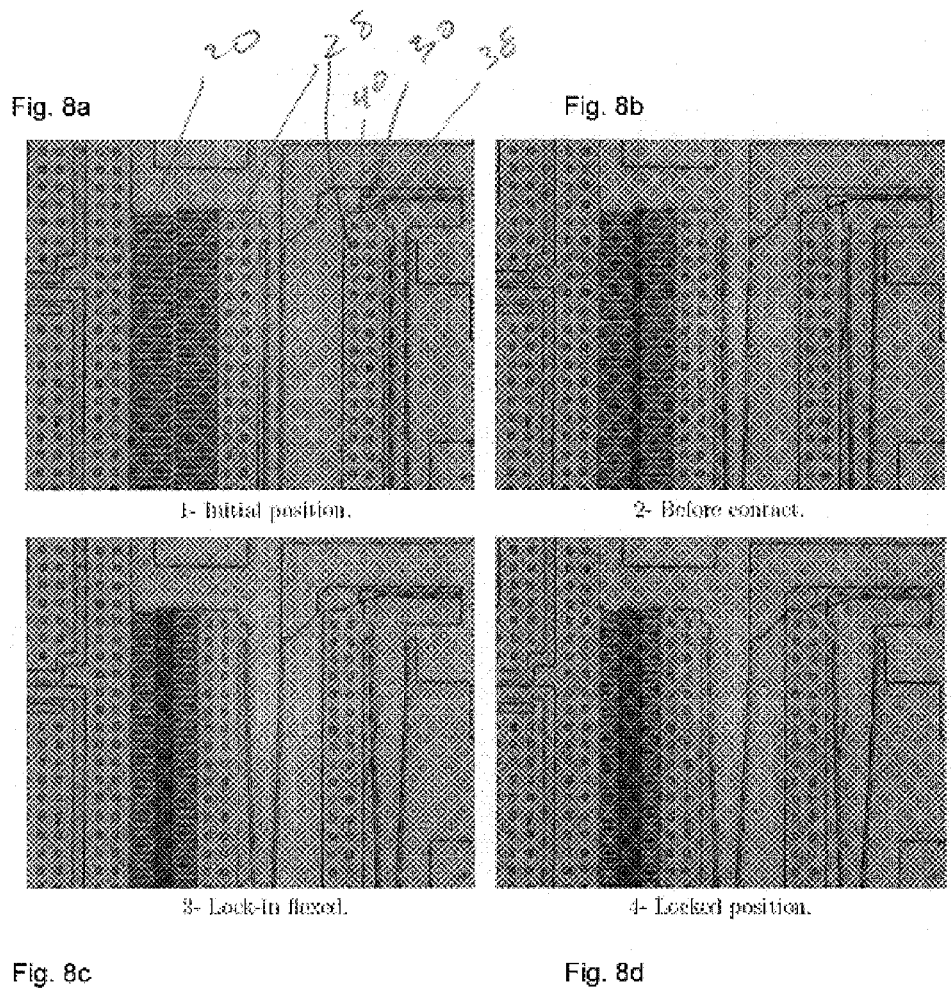
FIGS. 8a–8d are top plan view microphotographs of the assembly of the invention as described in FIGS. 5, 6a, 6b, 7a and 7b showing assembly and locking of the stage using a ratchet mechanism.
Figures 10A, 10B, 10C:
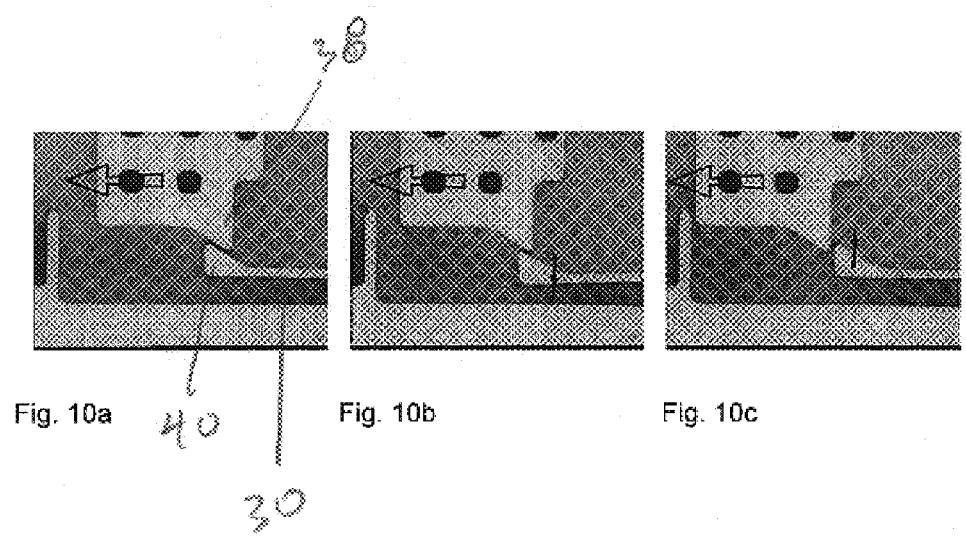
FIGS. 10a–10c are close-up top plan view microphotographs of the ratchet locking mechanism.

FIGS. 8a–8d and 10a–10c illustrate the locking sequence in a series of electron scanning microphotographs. In FIGS. 8a and 10a stage 28 and lock 30 are in an initial unlocked configuration. A triangular stop 40 is provided on the distal end of the flexible finger which forms lock 30. Stop 40 contacts and resiliently rides us a cam 38 defined on the side surface of stage 28 as best seen in FIG. 8b. Stage 28 continues to move to the left in the figure reaching a maximum flexure point of stop 40 on cam 38 as seen in FIGS. 8c and 10b. Further lateral movement of stage 28 results in the resilient inward movement of stop 40 behind stage 28 thereby locking stage 28 in its fully enmeshed lateral configuration as seen in FIGS. 8d and 10c.

Figures 9A, 9B:
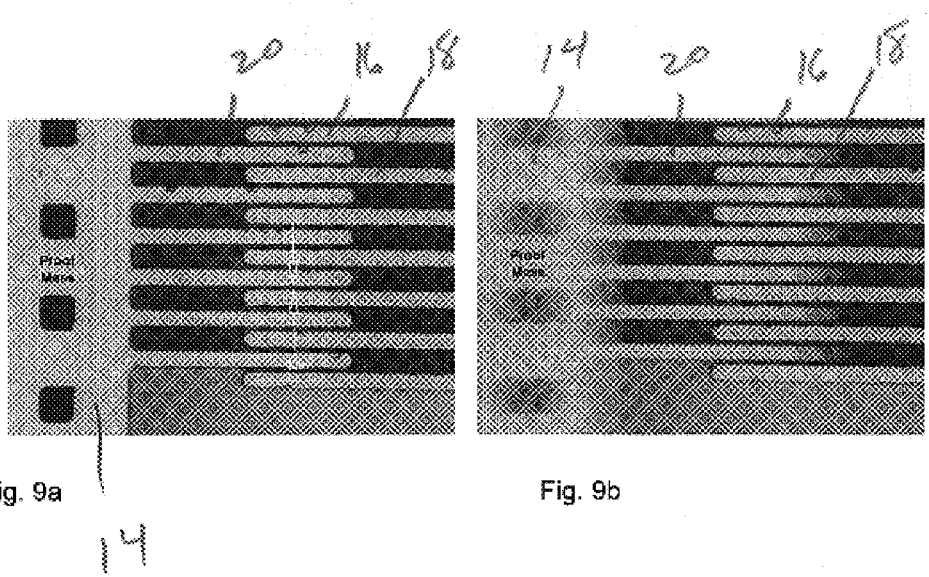
FIGS. 9a and 9b are top plan view enlarged microphotographs of the assembled invention in a quiescent state and operated in resonant state respectively.

FIGS. 9a and 9b are microscopic photographs of the assembled post-release positioning comb-drives integrated in a micromachined gyroscope. It is observed that excellent positioning is achieved, providing uniform gaps across the comb-drive structure as depicted in FIG. 9a. Also, the gyroscope proof-mass 14 is successfully driven into resonance in the drive-mode with the assembled comb fingers as depicted by the blurred image in FIG. 9b caused by the relative movement of mass 14 and fingers 20 relative to fingers 16 and 18. In atmospheric pressure, the assembled comb fingers with 15V DC bias and 7V AC provided the same oscillation amplitude as conventional comb-drives with 60V DC bias and 15V AC.

A thermal actuators is used in the illustrated embodiment for displacing the moving stage 28 and assembling the device 10. However, it is to be expressly understood that all actuation means now known or later devised for providing displacement in MEMS structures are deemed equivalent and included within the scope of the invention.

Figures 11A, 11B:
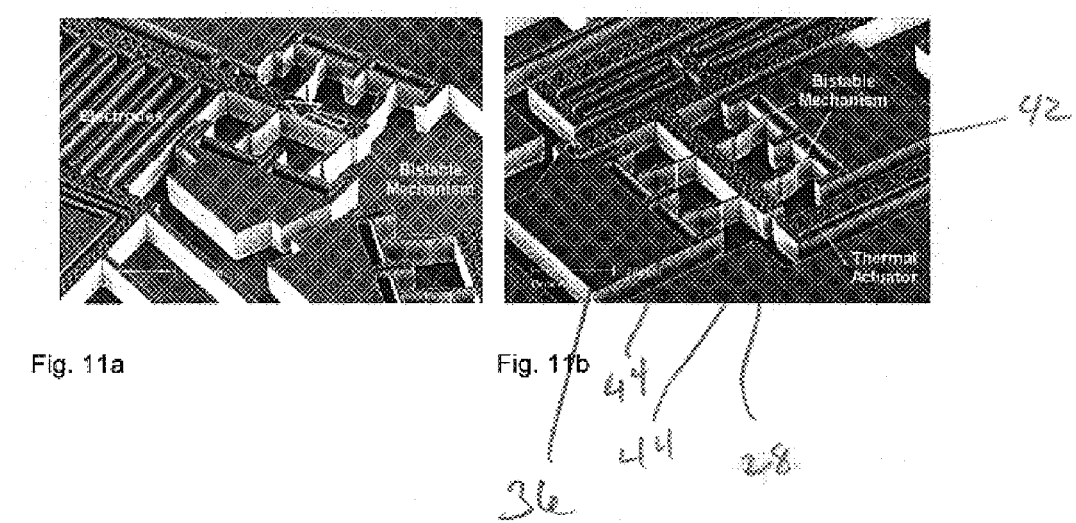
FIGS. 11a and 11b are perspective microphotographs of a bistable locking mechanism in two different devices.

The explored locking mechanism 30, includes but not limited to the ratched structure 30 in FIGS. 10a–10c, or a bistable lock mechanism 30 in FIGS. 11a and 11b. The principle of the bistable lock mechanism 30 FIGS. 11a and 11b is comprised of a pair of flexures 44 attached to a support spring 42 connected to substrate 36 at one end of flexure 44 and connected to stage 28 at the opposing end of flexure 44 or at least an extension of stage 28. Movement by a thermal actuator moves 28 laterally forward from an initial position shown in FIGS. 12a and 11a where flexures 44 are rearwardly directed to a compressed configuration shown in FIG. 12b, which is permitted by compression of springs 42. Continued lateral movement of stage 28 brings flexures 44 and springs 42 is a final locked or stable configuration as shown in FIGS. 12c and 11b where flexures 44 are forwardly directed. FIG. 12d shows resonance of mass 14 with the bistable lock 30 of FIGS. 11a, 11b, 12a–12c in the locked configuration.

In the gyroscopes of the illustrated embodiment, the gyroscope proof-masses 14 were successfully driven into resonance in the drive-mode with the assembled comb fingers, verifying that both the ratchet and bistable lock-in mechanisms 30 provide the required alignment and uniform finger spacing.

Figure 13A:
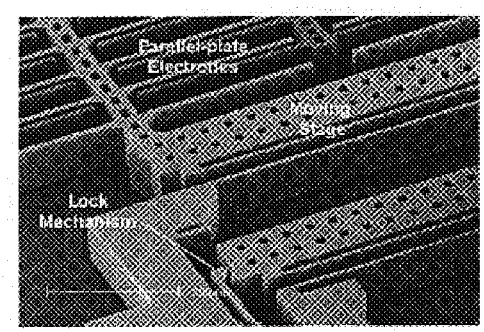
FIGS. 13a and 13b are perspective view microphotographs of the ratchet locking mechanism in a capacitive sensor where the sensing electrodes are laterally moved together to decrease the inter-electrode gap before and after assembly respectively.
Figure 13B:
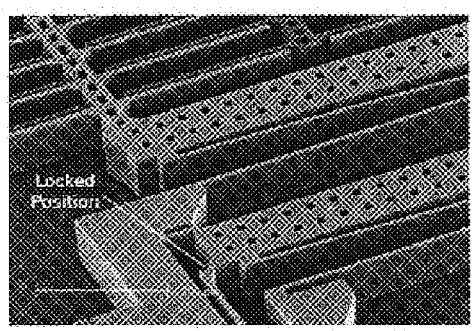
Figure 14A:
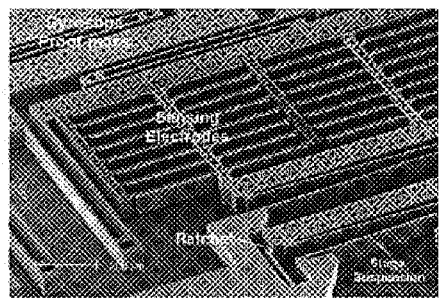
FIGS. 14a and 14b are an overall perspective view and close-up microphotographic perspective view of a capacitive sensor where the sensing electrodes are laterally moved together to decrease the inter-electrode gap.
Figure 14B:
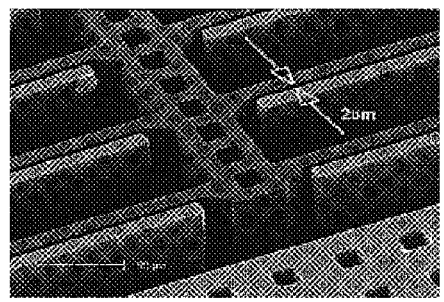

Enhancement of sensing capacitance as derived analytically in the background discussion above shows that the capacitance change due to deflection in a differential capacitive bridge is inversely proportional to the square of the initial gap. Thus, the sensitivity and resolution of the sensor 10 are improved quadratically by decreasing the initial gap of the sensing electrodes. Similar to enhancement of actuation capacitance, the stationary fingers 16, 18 of the sensing electrodes are attached to a moving stage 28 that locks into the desired position before operation, to minimize the electrode gap. This concept also has been implemented in bulk-micromachined gyroscopes, and the experimental results have successfully demonstrated the feasibility of the design concept. FIGS. 13a and 13b presents scanning-electron-microscope images of the post-release positioning sensing electrodes integrated in a micromachined gyroscope, before and after assembly respectively. It is observed that excellent positioning is achieved, providing uniform gaps across the sensing electrode structure. Electrode gaps in the order of 1–2 μm have been achieved with 100 μm thick structures as better shown in FIGS. 14a and 14b in an overall view and close up view respectively, while the minimum-gap requirement of the fabrication process is 10 μm.

Figure 15A:
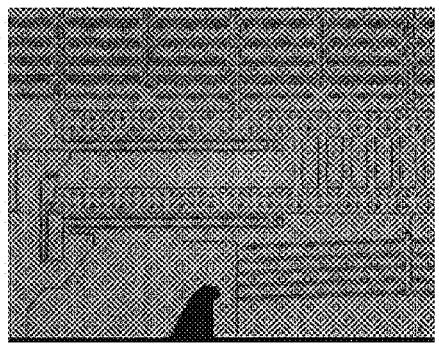
FIGS. 15a and 15b are top plan view microphotographs of a capacitive sensor of FIGS. 14a and 14b before and after assembly respectively.
Figure 15B:
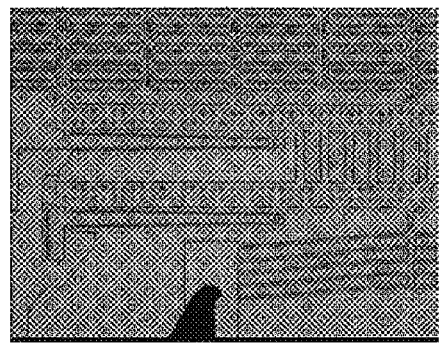

Thermal actuators are used in the illustrated embodiment for assembling the sensing electrodes 16, 18 and 20 as best depicted in the microphotographs of FIGS. 15a and 15b. The same locking mechanisms 30 were also successfully employed as described above. In the illustrated gyroscopes, the proof-mass 14 was driven into resonance in the sense-mode with the assembled parallel-plate sensing electrodes, verifying that the required alignment and uniform electrode spacing are achieved. FIGS. 15a and 15b show the assembly sequence of the post-release positioning comb-drives using thermal actuators integrated in a micromachined gyroscope before and after assembly respectively.

Immediate applications of the design concept include capacitive micromachined inertial sensors, especially accelerometers and gyroscopes, where the performance of the sensor is generally defined by the nominal capacitance of the sensing electrodes. The idea can also be implemented in various electrostatically actuated devices, where the nominal actuation capacitance has to be enhanced to minimize the required drive voltages.

Hence, it can now be appreciated that a post-release assembly technique is disclosed that aims to increase the sensing and actuation capacitances in micromachined sensors and actuators, in order to enhance the performance and noise characteristics beyond the fabrication process limitations. The approach is based on attaching the stationary electrodes 16, 18 of the device 10 to a moving stage 28 that locks into the desired position to minimize the electrode gap before operation. The concept has been implemented in bulk-micromachined gyroscopes, and the experimental results have successfully demonstrated the feasibility of the design concept. In the illustrated gyroscopes, capacitive enhancement by post-release positioning is performed using lock-in mechanisms; and very robust and fast positioning is achieved with thermal actuators.

It can now also be appreciated that the invention is a design concept in MEMS devices which offers the following advantages and differences over existing devices:

1. The performance of capacitive sensors (i.e. sensitivity, resolution, and signal to noise ratio) is improved by enhancing the nominal capacitance of the sensing electrodes beyond the minimum-gap capabilities of the fabrication process.
2. The drive signal feed-through is a major noise source in active devices such as micromachined gyroscopes. By increasing the actuation capacitances using the post-release assembly technique, the actuation voltages are minimized. Thus, the drive signal feed-through is minimized, and the noise characteristics are improved beyond the fabrication process limitations.
3. Capacitive enhancement by post-release positioning is performed using lock-in mechanisms; and very robust and fast positioning is achieved with thermal actuators.
4. The lock-in system and the flexure system suspending the moving stage provide very high stiffness after assembly, so that the stationary fingers are prevented from deflecting, and the required lateral stability is achieved.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An improvement in a MEMS device for capacitive enhancement comprising:
    a capacitive assembly having two sets of interdigitated fingers fabricated initially in a noninterdigitated configuration;
    a movable stage to which one of the two sets of interdigitated fingers are coupled;
    an actuator for selectively moving the stage from an initial position to a post-release position in which the two sets of interdigitated fingers are interdigitated with each other; and
    a lock for maintaining the stage in the post-release position.

2. The improvement of claim 1 where the noninterdigitated configuration is characterized by a minimum, fabricated gap size between adjacent fingers in each of the two sets, so that when in the post-release position the fingers in the two sets are spaced from each by less than the minimum, fabricated gap size.

3. The improvement of claim 1 where the capacitive assembly having two sets of interdigitated fingers comprises a capacitive sensor assembly.

4. The improvement of claim 1 where the capacitive assembly having two sets of interdigitated fingers comprises an electrostatic actuator assembly.

5. The improvement of claim 1 where the lock comprises a ratchet lock mechanism.

6. The improvement of claim 1 where the lock comprises a bistable lock mechanism.

7. The improvement of claim 1 where the MEMS device comprises a gyroscope or accelerometer.

8. The improvement of claim 1 where the device is fabricated in or on a substrate and where the stage comprises a stage body to which the one set of fingers are coupled, and two pairs of flexures coupling the stage body to the substrate, the two pairs of flexures functioning as a four-bar linkage to restrict movement of the stage body in a stable linear direction.

9. The improvement of claim 8 where two pairs of flexures are arranged and configured to provide high stiffness when the stage is locked into the post-release position so that the one set of fingers coupled to the stage body is substantially prevented from deflecting.

10. An improvement in a method of assembling a MEMS device to provide capacitive enhancement comprising:
    initially fabricating a capacitive assembly having two sets of interdigitated fingers in a noninterdigitated configuration;
    moving a stage to which one of the two sets of interdigitated fingers are coupled from an initial position to a post-release position in which the two sets of interdigitated fingers are interdigitated with each other; and
    locking the stage in the post-release position.

11. The improvement of claim 10 where initially fabricating the capacitive assembly in the noninterdigitated configuration comprises fabricating the assembly with a minimum, fabricated gap size between adjacent fingers in each of the two sets, and where moving the stage into the post-release position configures the fingers in the two sets so that the fingers are spaced from each by less than the minimum, fabricated gap size.

12. The improvement of claim 10 where the method of assembly is performed to assemble a capacitive sensor assembly.

13. The improvement of claim 10 where the method of assembly is performed to assemble an electrostatic actuator assembly.

14. The improvement of claim 10 where locking the stage comprises locking the stage with a ratchet lock mechanism.

15. The improvement of claim 10 where locking the stage comprises locking the stage with a bistable lock mechanism.

16. The improvement of claim 10 where the method of assembling a MEMS device comprises assembling a gyroscope or accelerometer.

17. The improvement of claim 10 where moving the stage comprises moving a stage body to which the one set of fingers are coupled by flexing two pairs of flexures which couple the stage body to the a substrate as a four-bar linkage to restrict movement of the stage body in a stable linear direction.

18. The improvement of claim 17 where moving the stage comprises coupling high stiffness to the stage from the flexures when the stage body is locked into the post-release position so that the one set of fingers coupled to the stage body is substantially prevented from deflecting.

* * * * *